US010587226B2

(12) United States Patent
Ahmed et al.

(10) Patent No.: US 10,587,226 B2
(45) Date of Patent: Mar. 10, 2020

(54) AMPLIFIER DEVICE WITH HARMONIC TERMINATION CIRCUIT

(71) Applicant: NXP USA, Inc., Austin, TX (US)

(72) Inventors: Maruf Ahmed, Gilbert, AZ (US); Margaret A. Szymanowski, Chandler, AZ (US); Joseph Staudinger, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/926,937

(22) Filed: Mar. 20, 2018

(65) Prior Publication Data

US 2019/0296693 A1     Sep. 26, 2019

(51) Int. Cl.
| H03F 3/191 | (2006.01) |
| H03F 1/02 | (2006.01) |
| H03F 1/56 | (2006.01) |
| H03F 3/195 | (2006.01) |

(52) U.S. Cl.
CPC ........... *H03F 1/0288* (2013.01); *H03F 1/565* (2013.01); *H03F 3/195* (2013.01); *H03F 2200/222* (2013.01); *H03F 2200/387* (2013.01); *H03F 2200/423* (2013.01); *H03F 2203/21139* (2013.01)

(58) Field of Classification Search
CPC ............. H03F 1/0288; H03F 2200/387; H03F 2203/21139; H03F 2200/423; H03F 3/191; H03F 1/56; H03F 1/565; H03F 3/1935; H03F 3/193; H03F 2200/372; H03F 1/302; H03F 2200/18; H03F 1/301
USPC ................................. 330/277, 302, 286, 295
See application file for complete search history.

(56) References Cited

U.S. PATENT DOCUMENTS

| 5,095,285 | A | 3/1992 | Khatibzadeh |
| 7,741,907 | B2 * | 6/2010 | Takagi .................... H03F 3/217 330/251 |
| 8,154,348 | B2 * | 4/2012 | Honjo ...................... H03F 1/56 330/302 |

(Continued)

FOREIGN PATENT DOCUMENTS

KR         20170078021 A         7/2017

OTHER PUBLICATIONS

Hanna, T. et al. "A class-J power amplifier for 5G applications in 28nm CMOS FD-SOI technology", 30th Symposium on Integrated Circuits and Systems Design (SBCCI), Fortaleza, pp. 110-113 (2017).

(Continued)

*Primary Examiner* — Khanh V Nguyen
(74) *Attorney, Agent, or Firm* — Bruce M. Green

(57) ABSTRACT

An amplifier device includes an input terminal, an output terminal, a first transistor having a control terminal and first and second current-carrying terminals, and a class-J circuit coupled between the second current-carrying terminal of the first transistor and the output terminal and configured to harmonically terminate the first transistor. The class-J circuit may include a first resonator, characterized by a first resonant frequency substantially equal to a second harmonic frequency. The first resonator may be coupled between the second current-carrying terminal and a voltage reference. A shunt inductor that is distinct from the first resonator may be coupled between the second current-carrying terminal and the voltage reference.

25 Claims, 8 Drawing Sheets

(56) References Cited

U.S. PATENT DOCUMENTS

| | | | | |
|---|---|---|---|---|
| 8,653,896 B2* | 2/2014 | Takagi | H01L 23/66 |
| | | | 330/302 |
| 8,947,166 B2* | 2/2015 | Uno | H03F 1/0205 |
| | | | 330/302 |
| 8,983,406 B2* | 3/2015 | Zhang | H03F 1/3205 |
| | | | 330/307 |
| 9,503,025 B2* | 11/2016 | Cao | H03F 1/0222 |
| 9,531,328 B2* | 12/2016 | Frei | H03F 1/0288 |
| 9,882,587 B2* | 1/2018 | Feng | H03F 3/217 |
| 2007/0057731 A1* | 3/2007 | Le | H03F 1/56 |
| | | | 330/302 |
| 2012/0218045 A1 | 8/2012 | Takagi et al. | |
| 2014/0266455 A1 | 9/2014 | Kaatz et al. | |
| 2015/0123734 A1* | 5/2015 | Donati | H03F 3/604 |
| | | | 330/295 |
| 2016/0173039 A1 | 6/2016 | Frei et al. | |
| 2016/0380603 A1 | 12/2016 | Zhang et al. | |

OTHER PUBLICATIONS

Wright, P., "A Methodology for Realizing High Efficiency Class-J in a Linear and Broadband PA," IEEE Transactions on Microwave Theory and Techniques, vol. 57, No. 12, pp. 3196-3204, Dec. 2009.

\* cited by examiner

AMPLIFIER DEVICE WITH HARMONIC TERMINATION CIRCUIT

TECHNICAL FIELD

Embodiments of the subject matter described herein relate generally to RF amplifiers.

BACKGROUND

High-efficiency radio-frequency (RF) amplifiers are finding increased use in communication base station applications. These high-efficiency RF amplifiers are desired because of the lower system size and cost achieved by the need for less cooling capability and because of the reduced energy needed to power these systems. Conventional high efficiency amplifiers (e.g. tuned class-AB) have theoretical efficiencies that approach 78% or, in some cases such as class-F, 100%. This high efficiency operation is achieved by terminating the active transistor of the amplifier at the harmonic frequencies of the frequency of amplifier operation. For example, an ideal tuned class-clAB amplifier may require all harmonics to be terminated in a short circuit. An ideal class-F amplifier may require terminating the even harmonics (i.e. $2^{nd}$, $4^{th}$, etc.) of the amplifier signal in a short circuit and the odd harmonics (i.e. $3^{rd}$, $5^{th}$, etc.) of the amplifier signal in an open circuit.

However, these conventional high efficiency RF amplifiers can be difficult to realize using packaged RF devices with matching circuitry realized external to the packaged RF devices, because the harmonic termination circuitry, especially the ideal open and short circuit terminations, may be difficult to realize using practical circuit elements. This often means that only a very narrow range of tuning conditions will provide high efficiency operation for RF amplifiers created with packaged devices. This narrow range of optimum tuning conditions introduces un-acceptable product variation and yield loss. In addition, the harmonic terminations may consume large areas of printed circuit board (PCB) in the amplifier system and thus compete with the goals of smaller area devices. Thus, amplifier devices with reduced sensitivity to external matching conditions are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Various embodiments of the inventive subject matter, pertaining to amplifier devices and described herein, include an input terminal, an output terminal, a first transistor and a class-J circuit coupled between the first transistor and the output terminal and configured to harmonically terminate the first transistor. The class-J circuit may include a first resonator, characterized by a first resonant frequency substantially equal to a second harmonic frequency. The first resonator may be coupled between the second current-carrying terminal and a voltage reference. A shunt inductor that is distinct from the first resonator may be coupled between the second current-carrying terminal and the voltage reference.

The amplifier device embodiments provided herein may overcome some or all of the aforementioned issues with high-efficiency amplifiers, while realizing these amplifiers in a compact form factor. Specifically, the amplifier device embodiments described herein efficiently terminate the harmonics frequency components of the amplifier signal, making the amplifier less sensitive to changes in harmonic tuning conditions outside the amplifier device.

Class-J amplification provides high efficiency amplification similar to tuned class-AB amplification, but is easier to realize with practical circuit elements. Of note, class-J circuits do not require termination of harmonics in ideal short circuits as is the case for tuned class-AB amplifiers. Rather, the transistor may be terminated with capacitive reactances.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
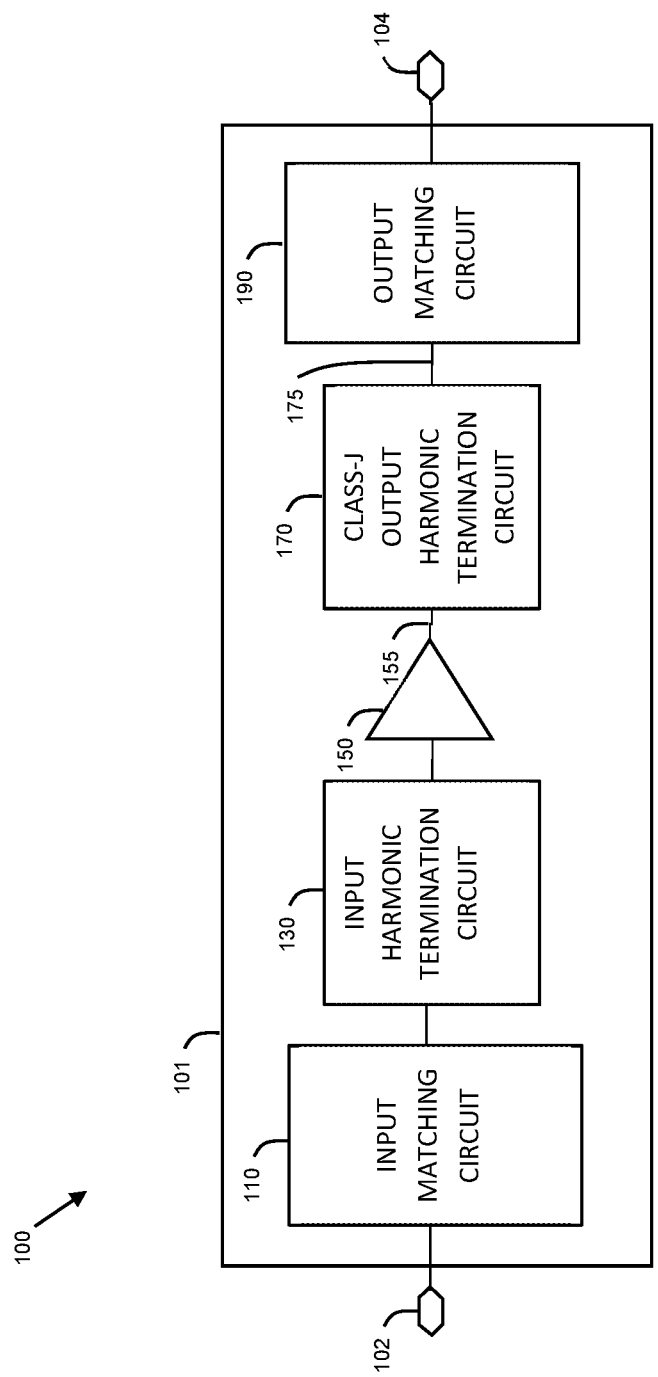
FIG. 1 is a simplified block diagram of an amplifier device, in accordance with an example embodiment.

FIG. 1 is a simplified block diagram of an amplifier device 100, in accordance with an example embodiment. According to an embodiment, the amplifier device 100 may include a base substrate 101, an input terminal 102, an output terminal 104, an input matching circuit 110, and input harmonic termination circuit 130, a first transistor 150, a class-J circuit 170, and an output matching circuit 180.

During operation, an RF signal received through the input terminal 102 is conveyed through the input matching circuit 110, which is configured to raise the impedance of amplifier device 100 to a higher impedance level (e.g., 50 Ohms or another impedance level) to enhance gain flatness and power transfer across the frequency band. The resulting RF signal is then filtered by the input harmonic termination circuit 130 to selectively remove, e.g., the second harmonic component of the RF signal. The resultant RF signal is then amplified by the first transistor 150. The amplified RF signal produced at the output 155 of the first transistor 150 is then conveyed through the class J output harmonic termination circuit 170. As will be described in connection with FIGS. 3 and 4, the class-J output harmonic termination circuit 170 shapes the current and voltage wave forms by using appropriate passive fundamental and harmonic terminations which result in high efficiency operation. The resulting RF signal produced at the output 175 of the class-J output harmonic termination circuit 170 is then conveyed to the output matching circuit 190. The output impedance matching circuit 190 is connected between the class-J output and is configured to match the output impedance of the first transistor 150 with the system impedance applied to output terminal 104.

Figure 2:
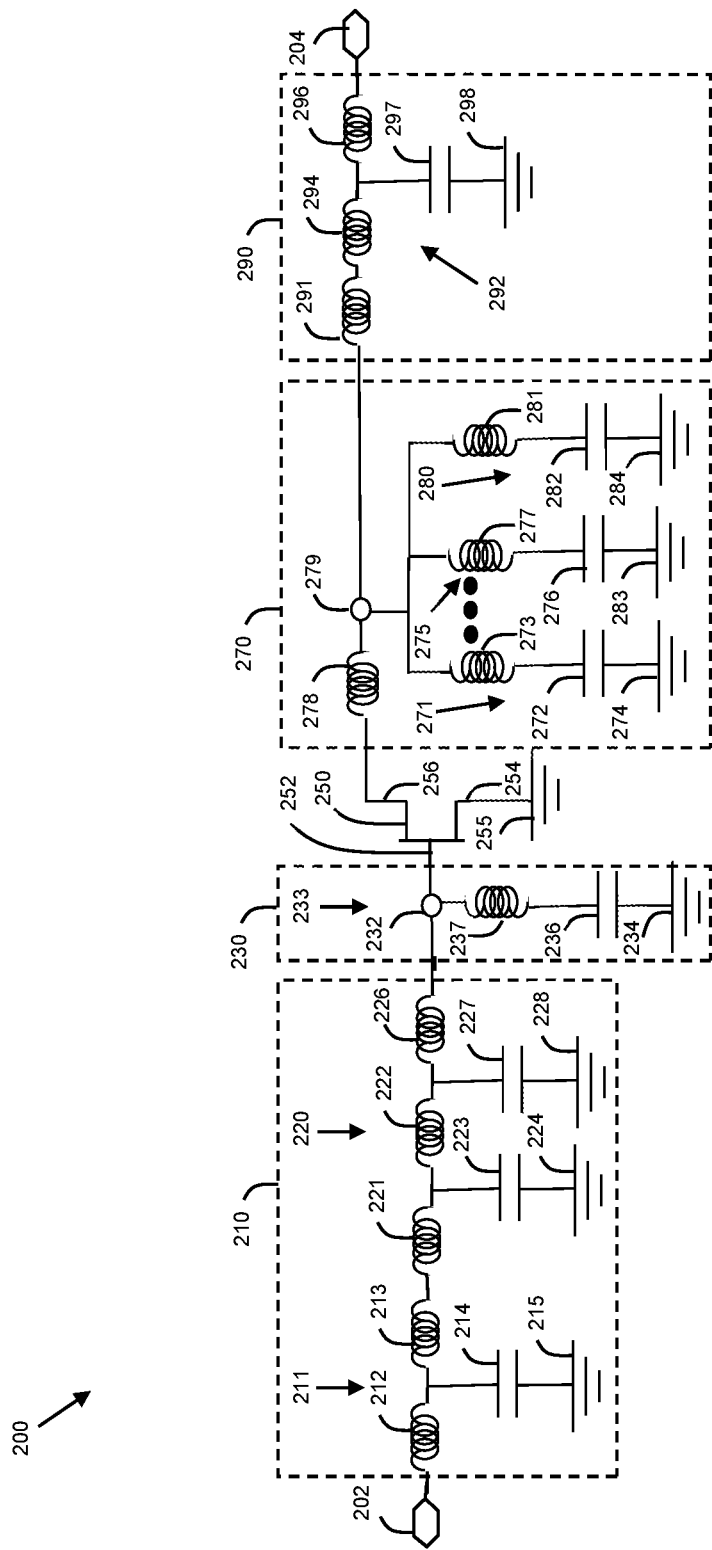
FIG. 2 is a schematic diagram of an amplifier device in accordance with an example embodiment.

FIG. 2 is a schematic diagram depicting amplifier device 100 of FIG. 1, showing circuit schematic details of the amplifier device 200, in accordance with an example embodiment. More particularly, corresponding components between FIG. 1 and FIG. 2 have the same last two numerical digits (e.g., components 130 and 230 are corresponding components, and components 170 and 270 are corresponding components). According to an embodiment, the amplifier device 200 may include an input terminal 202, an output terminal 204, an input matching circuit 210, an input harmonic termination circuit 230, a first transistor 250, a class-J circuit 270, and an output matching circuit 290.

In the foregoing descriptions, components may be coupled to various circuit grounds (i.e. "voltage references"). It should be appreciated that in other embodiments, (not shown) alternative voltage references may be used in place of circuit grounds referred to herein. These alternative voltage references may include a positive or negative direct current (DC) potential or alternating current (AC) potentials.

In an embodiment, the input matching circuit 210 may couple the input terminal 202 to the first transistor device 250. According to an embodiment, the input matching circuit 210 may include one or more circuit elements configured to raise the impedance seen at the input terminal 202 and provide maximum power transfer and gain over the frequency range of the amplifier device 200. In an example embodiment, a plurality of matching network sections may be cascaded to realize the needed impedance matching. In the example embodiment, a first input T-network 211 and a double T-network 220 may be coupled together to form the input matching circuit 210. The first input T-network 211 may include a first input series inductor 212, a second input series inductor 213 coupled to the first input series inductor 212, and a first input shunt capacitor 214 that couples the connection point of the first input series inductor 212 and the second input series inductor 213 to a circuit ground 215. In an example embodiment, and for a center frequency, $f_0$, of 3.5 GHz, the first and second series inductors 212 and 213 of the first T-network 211 may have a value in a range of about 0.15 NH and about 0.55 NH, though other higher or lower values may be used. In an embodiment, and for a center frequency, $f_0$, of 3.5 GHz, the first input shunt capacitor 214 may have a value in a range of about 0.1 pF and about 0.5 pF, though other higher or lower values may be used. The double T-network 220 may include a third input series inductor 221, a fourth input series inductor 222 coupled to the third input series inductor 221, a second input shunt capacitor 223 that couples the connection point of the third input series inductor 221 and the fourth input series inductor 222 to the circuit ground 224, a fifth input series inductor 226, and a shunt input capacitor 227 that couples the connection point of the fourth input series inductor 222 and the fifth input series inductor 226 to a circuit ground 228. In an embodiment, and for a center frequency, $f_0$, of 3.5 GHz, the third input series inductor 221 of the double T-network 220 may have a value in a range of about 0.1 nH and about 0.5 nH, though other higher or lower values may be used. In an embodiment, and for a center frequency, $f_0$, of 3.5 GHz, the fourth input inductor 222 may have a value in a range of about 0.1 nH and about 1.5 nH, though other higher or lower values may be used. In an embodiment, and for a center frequency, $f_0$, of 3.5 GHz, the second input shunt capacitor 223 may have a value in a range of about 2 pF and about 6 pF, though other higher or lower values may be used. In an embodiment, and for a center frequency, $f_0$, of 3.5 GHz, the fifth input series inductor 226 may have a value in a range of about 0.3 nH and about 1.1 nH, though other higher or lower values may be used. In an embodiment, and for a center frequency, $f_0$, of 3.5 GHz, the third input shunt capacitor 227 may have a value in a range of about 6 pF and about 16 pF, though other higher or lower values may be used.

An input harmonic termination circuit 230 may be coupled to an input harmonic termination node 232. According to an embodiment, the input harmonic termination circuit 230 may include an input harmonic termination resonator 233 coupled to input harmonic termination node 232. In an embodiment, the input harmonic termination resonator 233 may be coupled between the input harmonic termination node 232 and a circuit ground 234. The input harmonic termination resonator 233 may include an input harmonic termination capacitor 236 and an input harmonic termination inductor 237, according to an embodiment. In an example embodiment, and for a center frequency, $f_0$, of 3.5 GHz, the input harmonic termination capacitor 236 may have a value in a range of about 0.30 pF and about 0.9 pF, though other higher or lower values may be used. In an embodiment, and for a center frequency, $f_0$, of 3.5 GHz, the input harmonic termination inductor 237 may have a value in a range of about 0.4 nH and about 1.3 nH, though other higher or lower values may be used. The input harmonic termination resonator 233 may be characterized by an input harmonic termination resonant frequency, approximated by the expression, $f_0=1/(2\pi\sqrt{LC})$ where L is the inductance of the input harmonic termination inductor and C is the capacitance of the input harmonic termination capacitor 236, according to an embodiment. In an embodiment, the input harmonic termination resonant frequency may be substantially equal to a second harmonic frequency (e.g. 7 GHz) of the intended operating frequency of the amplifier device 200 (e.g. 3.5 GHz).

According to an embodiment, the first transistor 250 is the primary active component of the amplifier device 200. The first transistor 250 may include a control terminal 252, a first current-carrying terminal 254, and a second current-carrying terminal 256, where the current-carrying terminals are spatially and electrically separated by a variable-conductivity channel. In an embodiment, the first transistor 200 has an output capacitance between the first and second current-carrying terminals. In an embodiment, the first transistor 250 may include field effect transistors (FET's) (such as heterojunction FET's (HFET's), metal-semiconductor FET's (MESFET's), or metal oxide semiconductor FET's (MOSFET's)), each of which include a gate (control terminal), a source (a first current-carrying terminal), and a drain (a second current-carrying terminal). For convenience of explanation and not for limitation, various embodiments of the invention will be illustrated using GaN HFET active devices, which are preferred. However, many other active device types may also be employed and are intended to be included within the scope of the invention, as for example and not intended to be limiting, bipolar devices, junction field effect devices, various insulated gate field effect devices, and so forth. Alternatively, the first transistor 250 may include a bipolar junction transistors (BJT) or a heterojunction BJT (HBT). Accordingly, references herein to a "gate," "drain," and "source," are not intended to be limiting, as each of these designations has analogous features for a bipolar device implementation (e.g., a base, collector, and emitter, respectively).

According to an embodiment, and using nomenclature typically applied to FET's in a non-limiting manner, the gate terminal 252 (i.e. control terminal) may be coupled to the input harmonic termination node 232. In an embodiment, the source terminal 254 (i.e. first current-carrying element) of the first transistor 250 may be coupled to a circuit ground 255 (i.e. voltage reference). According to an embodiment, the drain terminal 256 (i.e. second current-carrying terminal) may be coupled to the class-J circuit 270. In an embodiment, the first transistor 250 may have a total gate width of between about 1 and about 40 millimeters (mm) (e.g. about 3.5 mm), although higher or lower values of the total gate width may be used in some embodiments. In an embodiment, the first transistor 250 has an input capacitance (i.e. gate-source capacitance) between the gate terminal 252 and source 254 of the first transistor 250. In an example embodiment, the first transistor 250 has a gate source capacitance between about 0.5 pF per millimeter of gate periphery (pF/mm) and about 3.5 pF/mm (e.g. 2.5 pF/mm), though higher or lower values may be used. In an embodiment, the first transistor 250 has an output capacitance (i.e. drain-source capacitance) between the drain terminal 256 and source terminal 254 of the first transistor 250. In an embodiment, the first transistor 250 has a drain-source capacitance between about 0.2 pF per millimeter of gate periphery (pF/mm) and about 1 pF/mm (e.g. about 0.4 pF/mm), though other higher or lower values may be used.

Figure 3:
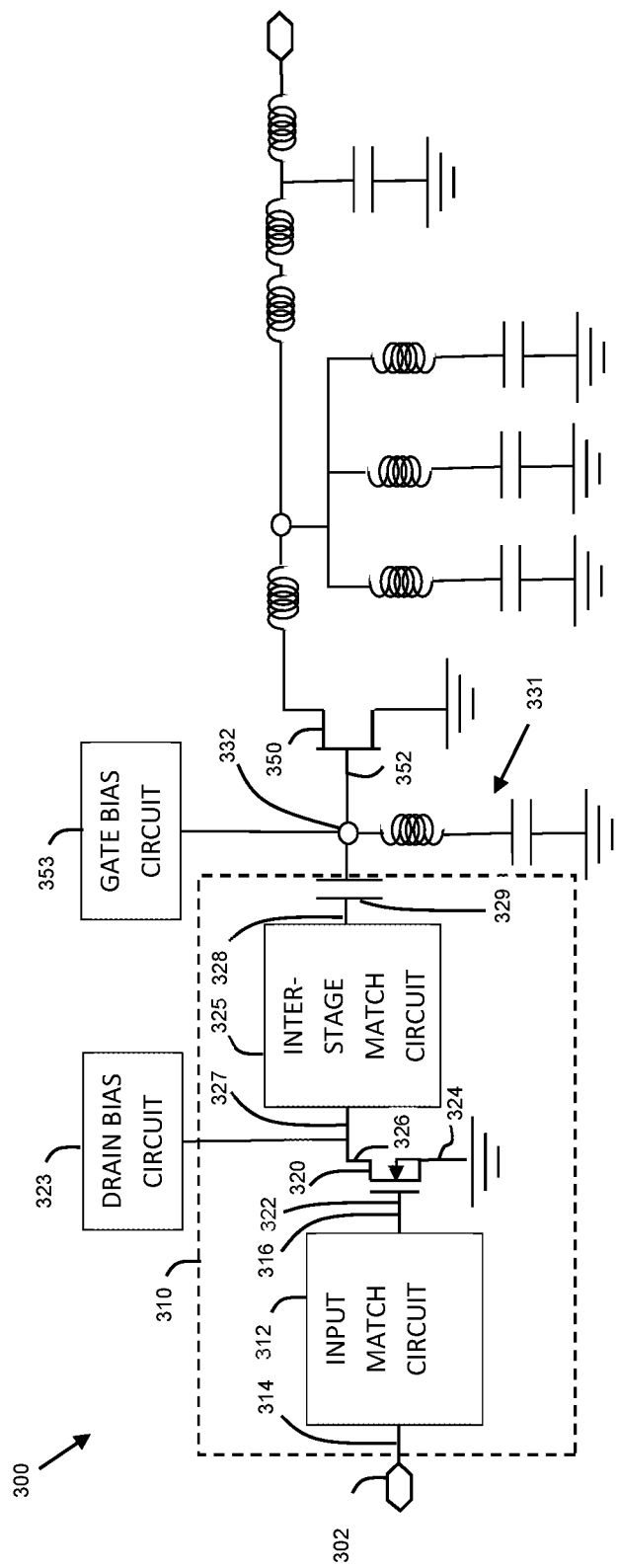
FIG. 3 is a schematic diagram of an amplifier device in accordance with an alternate embodiment.

In other, alternate embodiments of the inventive subject matter, an active matching element (e.g. a transistor stage) may be incorporated into or in place of the input matching circuit 210 of FIG. 2. FIG. 3 is a schematic diagram of an amplifier device in accordance with an alternate embodiment wherein an active matching element is incorporated into the input matching circuit. In this embodiment, an input driver circuit 310 takes the place of the matching circuit 210 of FIG. 2. In these embodiments, the input driver circuit may include an input match circuit 312, a second transistor 320 coupled to the input match circuit 312, and an inter-stage match circuit 325 that couples to an input harmonic termination node 332 of the input harmonic termination 331 via a DC blocking capacitor 329. During operation an RF signal applied at an input terminal 302 may be conveyed through the input 314 of the input match circuit 312. The input match circuit 312 may include one or more low-pass (e.g. T-network), high-pass, or other suitable matching networks configured to transform the impedance of the gate terminal 322 of the second transistor 320 to the system impedance presented to input terminal 302, according to an embodiment. In an embodiment, the second transistor 320 may include a GaN transistor. In other embodiments, the second transistor 320 may include a laterally diffused, metal oxide semiconductor (LDMOS) transistor. Other embodiments may include gallium arsenide (GaAs) devices, and silicon-germanium (SiGe) devices. The second transistor 320 may include analogous terminals (e.g. gate terminal 252, drain terminal 256, and source terminal 254) described in connection with the first transistor 250, FIG. 2 in accordance with an embodiment. The second transistor 320 may include a second transistor gate terminal 322 (i.e. "second control terminal"), an active transistor source terminal 324 (i.e. third current-carrying terminal), and an active transistor drain terminal 326 (i.e. fourth current-carrying terminal). The second transistor 320 may be biased in forward active-operation (e.g. class-AB bias) using a DC bias applied at the second transistor gate 322 via the input terminal 302. A drain bias may be applied to the drain terminal 326 of the second transistor 320 through a drain bias circuit 323. During operation, the RF signal may be conveyed from the output terminal 316 of the input match circuit 312 to the second transistor gate terminal 322 and an amplified version RF signal may be generated at the second transistor drain terminal 326. The resulting amplified RF signal may then be conveyed from the inter-stage input 327 of the inter-stage match circuit 325 to the inter-stage output 328. The inter-stage match circuit 325 may transform the impedance of the second transistor drain terminal 326 to match that of the gate terminal 352 of the first transistor 350, according to an embodiment. The amplified RF signal is then conveyed from the inter-stage output 328 to the input harmonic termination node 332 of the input harmonic termination circuit 330, according to an embodiment. In an embodiment, a gate bias may be applied to the gate 352 of the first transistor 350 via a gate bias circuit 353. At that point (i.e. at gate terminal 352 and beyond), the amplifier device 300 may have the same features and functions as the amplifier device 200, according to an embodiment. In an embodiment, these features may be identical to that of amplifier device 200 of FIG. 2 and will only be described in connection with FIG. 2 for the purpose of brevity.

Referring again to FIG. 2 and, according to an embodiment, the class-J circuit 270 may include a first resonator 271 and a second resonator 275, both coupled to the output harmonic termination node 279 (i.e. "first node") and coupled to the drain terminal 256 of the first transistor 250 via a series inductor 278. The first resonator 271 may be coupled between an output harmonic termination node 279 and a circuit ground 274.

As used herein, the term "class-J" refers to a power amplifier mode of operation wherein an output harmonic termination circuit (e.g. 170, 270, FIGS. 1, 2) may present an inductive impedance load at the fundamental frequency, $f_0$, of the amplified signal, while at the same time, may present an impedance that includes a capacitive reactance at the harmonic frequencies of the amplified signal. In an embodiment, and under ideal class-J operation, the impedance at the fundamental frequency, $Z_{f0}$, seen by an internal current source of the first transistor 250 may be expressed as $Z_{f0}=R_L+j*R_L$ where $R_L$ is the optimum resistive impedance. At the second harmonic frequency, the load impedance may be given by $Z_{2f0}=0-j*3\pi/8*R_L$ and may have a capacitive reactance component. In an embodiment, the inductive portion of the fundamental output load phase-shifts the drain voltage waveform seen at the drain terminal 256 of the first transistor 250 relative to the associated current waveform such that the voltage waveform leads the current waveform in phase. In an embodiment, the capacitive reactance at the second harmonic frequency may cause an additional second harmonic component to cause additional peaking in the voltage waveform, beyond the 2 $V_{DD}$ maximum voltage swing that is well known for conventional class-AB amplifier operation where $V_{DD}$ refers to the supply voltage applied at the drain terminal 256 of the first transistor 250.

The first resonator 271 may include a first output harmonic termination capacitor 272 and a first output harmonic termination inductor 273, according to an embodiment. In an embodiment, and for a center frequency, $f_0$, of 3.5 GHz, the first output harmonic termination capacitor 272 may have a value in a range of about 0.15 pF and about 0.45 pF, though other higher or lower values may be used. In an embodiment, and for a center frequency, $f_0$, of 3.5 GHz, the first output harmonic termination inductor 273 may have a value in a range of about 0.8 nH and about 2.4 nH, though other higher or lower values may be used. The first resonator 271 may be characterized by a first resonant frequency approximated by the expression, $f_0=1/(2\pi\sqrt{LC})$, where L is the inductance of the first output harmonic termination inductor 273 and C is the capacitance of first output harmonic termination capacitor 272. In an embodiment, the first resonant frequency may be substantially equal to a second harmonic frequency of the intended operating frequency the amplifier device 200. In an embodiment, a second resonator 275 may be coupled between the output harmonic termination node 279 and the circuit ground 274. In an embodiment, the second resonator 275 may include a second output harmonic termination capacitor 276 and a second output harmonic termination inductor 277. In an embodiment, and for a center frequency, $f_0$, of 3.5 GHz, the second output harmonic termination capacitor 276 may have a value in a range of about 0.15 pF and about 0.45 pF, though other higher or lower values may be used. In an embodiment, and for a center frequency, $f_0$, of 3.5 GHz, the second output harmonic termination inductor 277 may have a value in a range of about 0.35 nH and about 1.1 nH, though other higher or lower values may be used. The second resonator 275 may be characterized by a second resonant frequency substantially equal to a third harmonic frequency. As used herein, the term "second harmonic frequency" or "third harmonic frequency" refers to a frequency component of an RF signal produced at the drain terminal 256 (i.e. second current-carrying terminal and the output terminal 204), as a result of the nonlinear behavior of first transistor 250 (and possibly second transistor 320 for the alternate embodiment of FIG. 3), that is two (for second harmonic) or three (for third harmonic) times the frequency of a signal placed on the input terminal 202 (i.e. 2f0, 3f0). In an embodiment, the series inductor 278 of the class-J circuit 270 may be coupled to the drain terminal 256 (i.e. second current-carrying terminal) and the output harmonic termination node 279. In an embodiment, the value of the series inductor 278 may be chosen such that it resonates with the output capacitance of the first transistor 250 at a frequency below the first resonant frequency (i.e. the $2^{nd}$ harmonic frequency). In an embodiment, and for a center frequency, $f_0$, of 3.5 GHz and output capacitance of a first transistor of approximately 1 pF (e.g. for a 0.5 micrometer gate length GaN transistor with a total gate width of approximately 3.5 mm), the series inductor 278 may have a value in a range of about 0.5 nH and about 1.6 nH, though other higher or lower values may be used.

Figure 4:
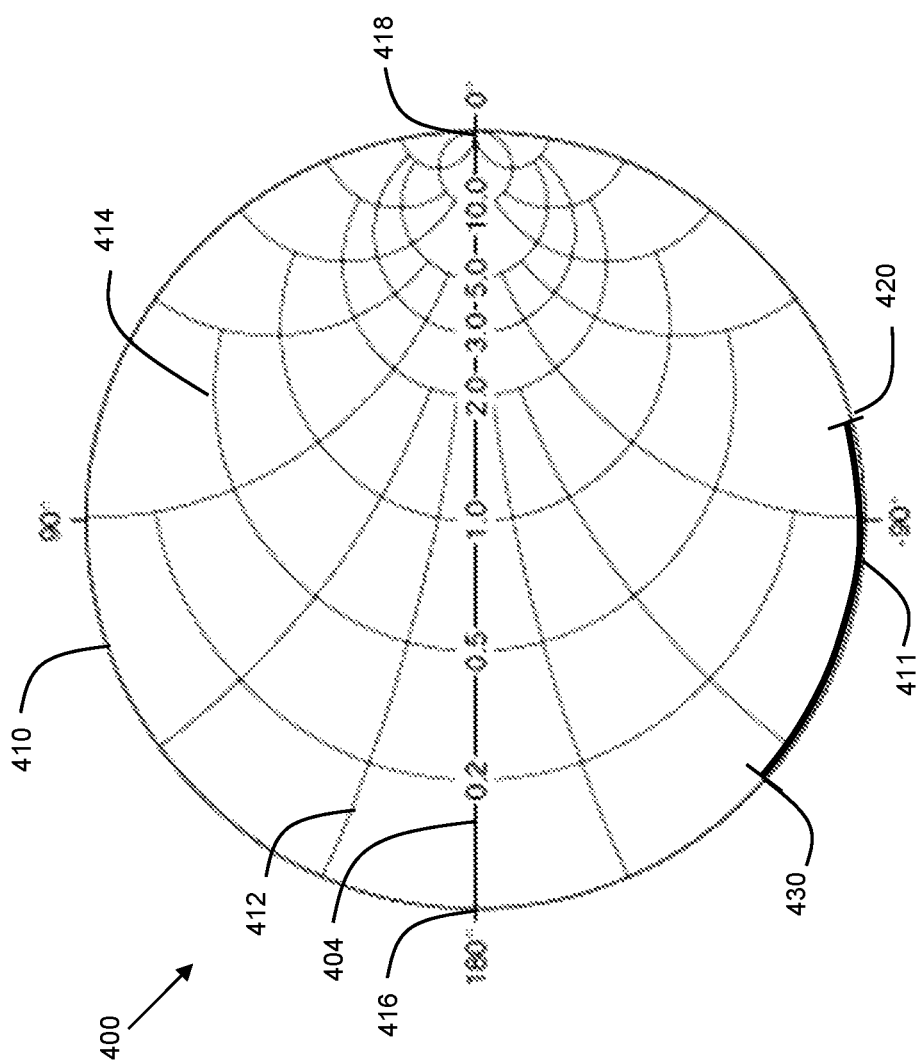
FIG. 4 is a graphical representation depicting class-J operation of the amplifier device of FIGS. 1 and 2.

Referring simultaneously now to FIG. 4 and FIG. 2, a graphical representation 400 depicting harmonic terminations realized with the class-J circuit 270 is shown in connection with an example embodiment. Graph 410 depicts a Smith chart representation of the complex impedance plane, wherein the reflection coefficients are mapped to the impedance of the network using the expression $S_{11}=(Z-Z_0)/(Z+Z_0)$ where Z refers to the impedance of the network and $Z_0$ refers to the characteristic impedance of the system. Partial circles of constant reactance 412 intersect circles of constant resistance 414. Circles of increasingly smaller constant resistance intersect the real axis at a point 416 that approaches zero resistance while circles of increasingly higher constant resistance approach a point along the real axis 404 that approaches infinite resistance 418. The regions above the real axis 404 denote positive or inductive reactance and regions below the real axis 404 denote negative or capacitive reactance. The reflection coefficient, $S_{11}$, well known to those with skill in the art is defined as the complex ratio of a test signal $b_1$ reflected from an input port of a network (e.g. FIG. 2, series inductor 278) in response to an incident test signal $a_1$ under the assumption that all other ports (e.g. FIG. 2, harmonic termination node 279) are matched and no reflected energy may enter these ports. As used here, $S_{11}$ is evaluated with the class-J circuit 270 coupled to the output matching circuit 290 at harmonic termination node 279. In this analysis, the output matching circuit 290 is terminated in a 50-ohm load. Trace 411 shows the reflection coefficient, $S_{11}$ of the class-J harmonic termination circuit, as seen by the drain terminal 256 (i.e. second current-carrying terminal) of the first transistor 250. As seen at a frequency point 420 at a second harmonic frequency (e.g. 7 GHz) of the fundamental frequency (e.g. 3.5 GHz) along trace 411, the magnitude of $S_{11}$ is approximately 1 (nearly zero resistance) and is at a point capacitive reactance. As seen at a frequency point 430 at a third harmonic frequency (e.g. 10.5 GHz) of the fundamental frequency (e.g. 3.5 GHz) along trace 411, the magnitude of $S_{11}$ is approximately 1 and is at a point lower capacitive reactance relative to the capacitive reactance represented by frequency point 420.

At their respective resonant frequencies, the first resonator 271 and the second resonator 275 effectively become short circuits. Thus, at the resonant frequency, drain terminal 256 (i.e. second current-carrying terminal) of the first transistor 250 is effectively terminated by the series inductor 278, according to an embodiment. In an embodiment, a matching network 280 that includes a shunt inductor 281 may couple the output harmonic termination node to a circuit ground 284 via a shunt blocking capacitor 282. In an embodiment, and of note, the shunt matching inductor 281 may raise the impedance seen at the output harmonic termination node at the fundamental frequency to a value that is between about 10 ohms and about 30 ohms, though other larger or smaller impedances may be realized in other embodiments. In an embodiment, and also of note, the relatively higher impedance value seen at the output harmonic termination node 279 due to the shunt inductor may simplify the design of the output matching circuit 290. Also, the shunt inductor 281 may reduce the phase shift of the class-J circuit 270 in an embodiment. In an embodiment, the minimum phase shift of the class-J circuit 270 enabled by the shunt inductor 281 may make the amplifier device 200 desirable for Doherty amplifiers (e.g. 500, FIG. 5). In an example embodiment, and for a center frequency, $f_0$, of 3.5 GHz, the shunt matching inductor 281 may have a value in a range of about 0.4 nH and about 1.2 nH, though other higher or lower values may be used. Also, in an embodiment, and for a center frequency, $f_0$, of 3.5 GHz, the blocking capacitor 282 may have a value in a range of about 20 pF and about 70 pF, though other higher or lower values may be used.

The output matching circuit 290 may couple the drain terminal 256 (i.e. second current-carrying terminal) of the first transistor 250 to the output terminal 204, according to an embodiment. In an embodiment, the output matching circuit 290 may include a first output series inductor 291 that couples to the second T-network 292. In an example embodiment, and for a center frequency, $f_0$, of 3.5 GHz, the first output series inductor 291 may have a value in a range of about 0.15 nH and about 0.45 nH, though other higher or lower values may be used. The second T-network 292 may include a second output series-connected inductor 294 coupled to a third output series inductor 296, and a first output shunt capacitor 297 coupled between a circuit ground 298 and the connection point of the second output series inductor 294 and the third output series inductor 296. In an embodiment, and for a center frequency, $f_0$, of 3.5 GHz, the first and second output series inductors 294 and 296 may have a value in a range of about 0.05 nH and about 0.25 nH, though other higher or lower values may be used. In an embodiment, and for a center frequency, $f_0$, of 3.5 GHz, the first shunt output capacitor 297 may have a value in a range of about 0.1 pF and about 0.5 pF, though other higher or lower values may be used.

Without departing from the scope of the inventive subject matter, it should be noted that the class-J realization of the output harmonic termination network is exemplary and non-limiting. Other embodiments of the inventive subject matter may include class-C, continuous-mode class F, or other non-limiting classes of amplifier operation with a reactive fundamental frequency impedance match in conjunction with capacitive reactance at the harmonic frequencies. These other embodiments may include the shunt inductor 281 to raise the impedance of the harmonically terminated circuit.

Figure 5:
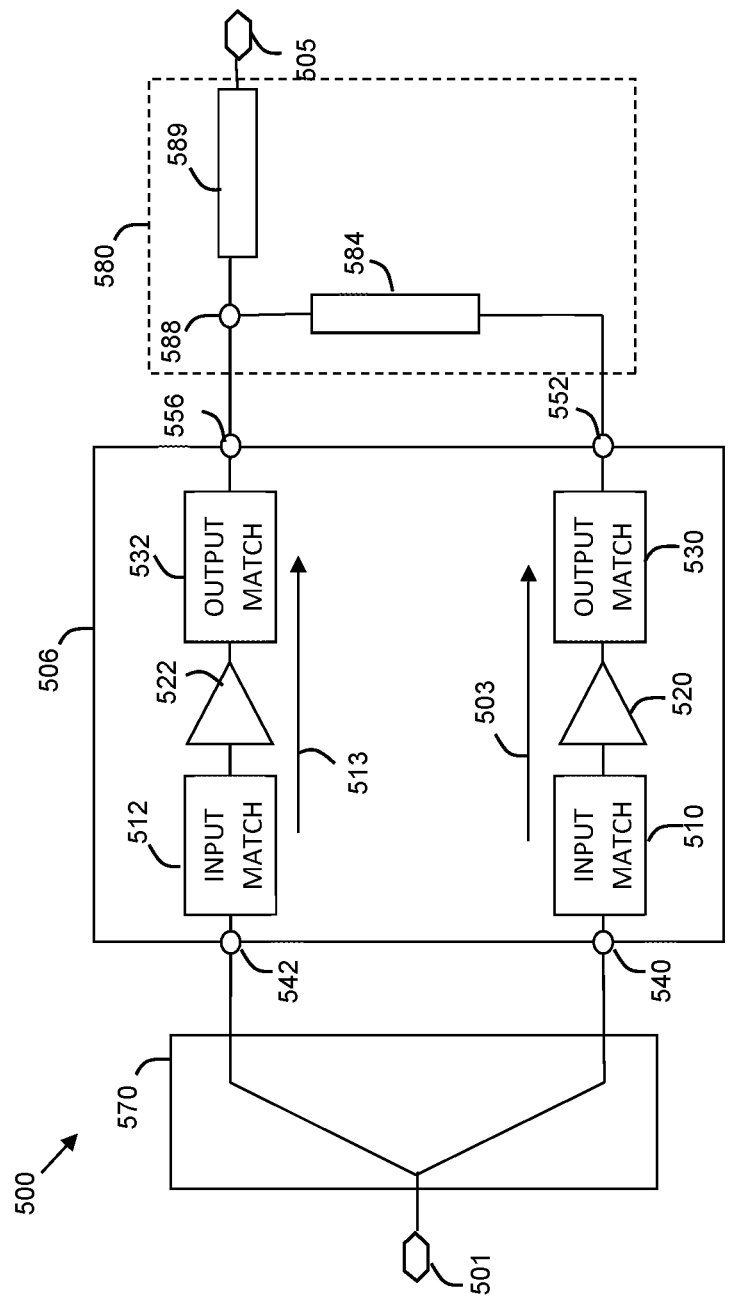
FIG. 5 is a schematic diagram of an amplifier device configured in a Doherty amplifier configuration.

FIG. 5 is a simplified block diagram of a Doherty amplifier 500 in accordance with an example embodiment. More specifically, Doherty amplifier 500 includes multiple amplifier paths 503, 513, where at least one of the amplifier paths (e.g., amplifier path 503) includes an embodiment of class-J output harmonic termination circuit. Although a two-way Doherty amplifier 500 is illustrated in FIG. 5 and described in detail herein, those of skill in the art would understand, based on the description herein, that embodiments of the inventive subject matter could be applied to amplifiers having more than two parallel amplification paths (e.g., a Doherty amplifier with a carrier amplifier path and more than one peaking amplifier paths).

The Doherty amplifier 500 includes an input node 501, an output node 505, a packaged amplifier device 506 (i.e. "amplifier device"), a power divider 570, and a power combiner 580, according to an embodiment. Essentially, an input signal received at input node 501 is amplified by the Doherty amplifier 500 and provided to a load (e.g., an antenna, not shown) via the output node 505. As will be described in more detail below, the amplifier 500 is configured in a Doherty amplifier topology. Accordingly, the amplifier device 506 may include multiple amplifier paths, which include a carrier path 503 and one or more peaking paths 513, respectively.

The power divider 570 is coupled between input node 501 and input terminals 540, 542 to the packaged amplifier device 506. The power divider 570 is configured to divide the input power of an input signal received at node 501 into multiple portions of the input signal, where respective portions of the input signal are provided to input terminals 540, 542. For example, a first output of the power divider 570 may be coupled to the input terminal 540 corresponding to the carrier path 503, and a second output of the power divider 570 may be coupled to the input terminal 542 corresponding to the peaking path 513. The power divider 570 may divide the input power equally among the amplifier paths 503, 513, such that roughly half of the input signal power is provided to each path 503, 513. Alternatively, the power divider 570 may divide the power unequally.

In some embodiments, the packaged amplifier device 506 (e.g. FIG. 8, 800) is a packaged electrical component, which is coupled to a PCB that includes components of the Doherty amplifier 500 that are not contained within amplifier device 506. Accordingly, input and output terminals 540, 542, 552, 556 of the packaged amplifier device 506 represent the interface between the packaged amplifier device 506 and amplifier components that are external to the amplifier device 506. That interface is more commonly referred to as the "package plane" of the Doherty amplifier 500.

Within the packaged amplifier device 506, the carrier and peaking paths 503, 513 each include an input impedance matching circuit 510, 512 (e.g. 210, 230, FIG. 2) an amplifier stage 520, 522 (e.g. first transistor 250 FIG. 2) and an output matching circuit 530, 532 (e.g. 270, 290, FIG. 2) coupled in series between input terminals 540, 542 and output terminals 550, 552. The input matching circuits 510 and 512 may contain the input matching circuit 210 and input harmonic termination 230 of FIG. 2, according to an embodiment. Each of the input impedance matching circuits 510, 512 (e.g. 210, 230, FIG. 2) is configured to provide a desired input impedance at its respective input terminal 540, 542 at the fundamental frequency (or carrier frequency), $f_0$, of the amplifier 500. The output matching circuits 530 and 532 may contain the class-J circuit 270 and output matching circuit 290 of FIG. 2, according to an embodiment. Thus, in an embodiment, each of the output matching circuits 530, 532 (e.g. 270, 290, FIG. 2) is configured to provide a desired output impedance and terminate harmonic frequencies at its respective output terminal 550, 552 at $f_0$. In an exemplary embodiment, the amplifier 500 is used to amplify RF signals, and $f_0$ is the frequency of operation.

One or both input impedance matching circuits 510, 512 may be realized as a low-pass impedance matching circuit (e.g., a shunt capacitance impedance matching circuit topology, e.g. 210, FIG. 2) and an input harmonic termination circuit (e.g. 230, FIG. 2). In alternate embodiments, either or both input impedance matching circuits 510, 512 may be realized as a low-pass impedance matching circuit (e.g. 210, FIG. 2) and class-J output harmonic termination circuit (e.g. 270, FIG. 2). The peaking-path output impedance matching circuit 532 may be realized as a low-pass impedance matching circuit topology or as a high-pass impedance matching circuit topology, in various embodiments. The peaking-path output impedance matching circuit 532 may have a different topology from the carrier-path output matching circuit 530, in an embodiment, although they may have the same topology in other embodiments.

Given that amplifier 500 is a Doherty amplifier, amplifier stage 520 is biased to operate in class-AB mode, and amplifier device 522 is biased to operate in class C mode. More specifically, the transistor arrangement of the carrier amplifier stage 520 is biased to provide a conduction angle between 180 and 360 degrees. Conversely, the transistor arrangement of the peaking amplifier stage 522 is biased to provide a conduction angle less than 180 degrees. According to various embodiments, the amplifier stages 520, 522 may be asymmetrical (i.e., of different sizes) or symmetrical (i.e., substantially the same size).

Figure 8:
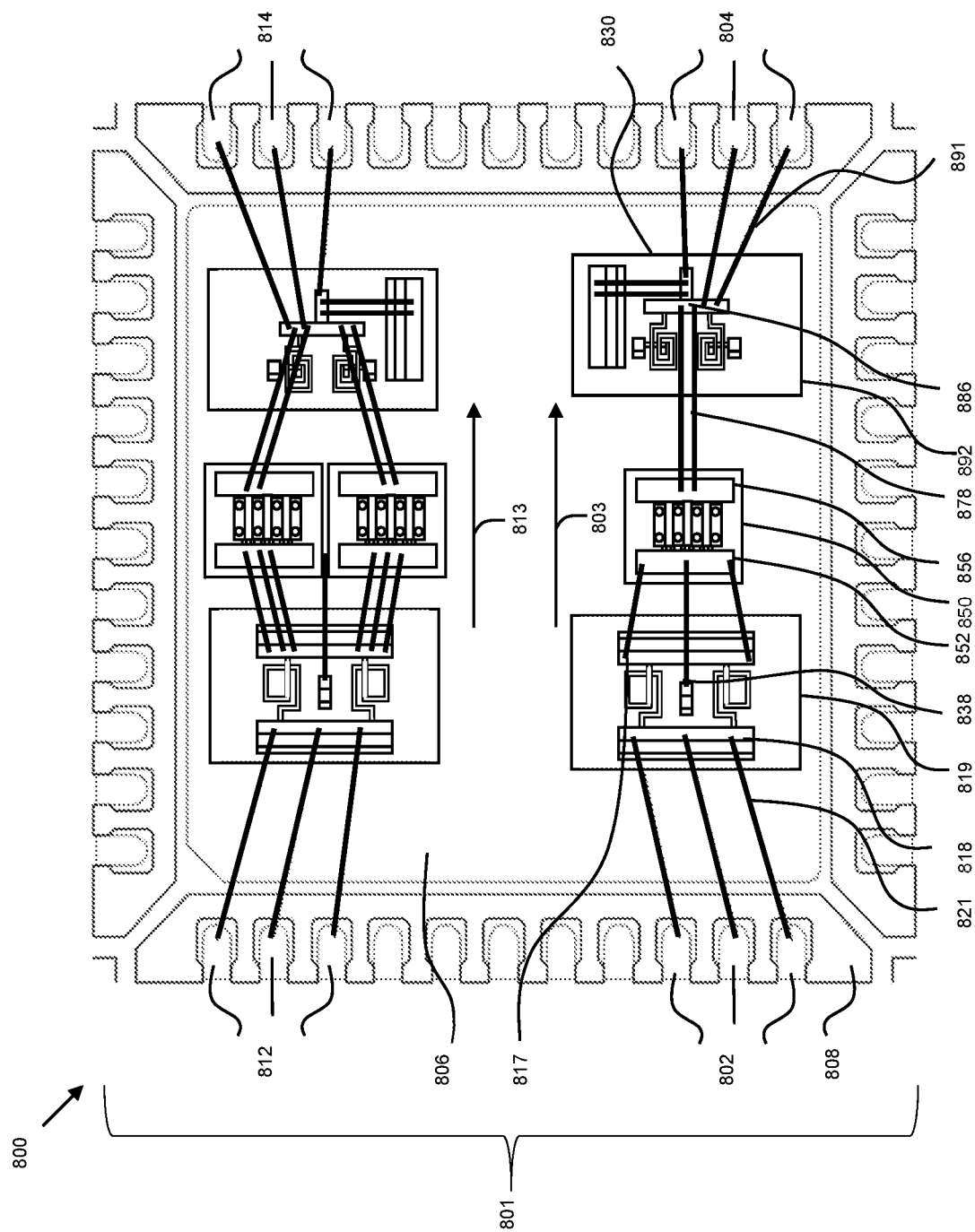
FIG. 8 is a top-down, plan view of a packaged amplifier device in accordance with an example embodiment.

In an embodiment, the multiple amplifier paths 513, 503 may be contained within a single device package (e.g. 800, FIG. 8, described hereafter) in which the input and output terminals 540, 542, 550, 552 provide external electronic connectivity to the amplifier 500. More specifically, the input and output terminals 540, 542, 552, 556 generally represent the package leads, pins, contacts, or other physical interfaces for providing electrical connections to the internal components (e.g., amplifier paths 503, 513) of the amplifier 500. Referring to later-described embodiments, for example, input terminals 540, 542 may correspond to input lands 802, 812 (FIG. 8), and output terminals 552, 556 may correspond to output lands 804, 814 (FIG. 8). In an alternate embodiment, the multiple amplifier paths 503, 513 may be contained in separate and distinct device packages.

Power combiner 580 is coupled between output terminals 552, 556 of the packaged amplifier device 506 and the output node 505. The power combiner 580 includes two inputs, a transmission line section 584, a summing node 588, and an output transformer 589 that is coupled to the output node 505. The output terminals 550, 552 each may be coupled to an input to the power combiner 580, and thus to the summing node 588, which combines amplified signals received from the amplifier paths 503, 513.

The power divider 570, the packaged amplifier device 506, and the power combiner 580 are designed so that the total phase shifts applied along the amplifier paths 503, 513 ensure that the currents ultimately provided to summing node 588 by the respective amplifier paths 503, 513 are received substantially in-phase with each other. Accordingly, the current provided by the summing node 588 to output node 505 represents the in-phase summation of the currents provided by amplifier paths 503, 513.

It should be understood that FIG. 5 is a simplified representation of a Doherty amplifier 500 for purposes of explanation and ease of description, and that practical embodiments may include other devices and components to provide additional functions and features, and/or the Doherty amplifier 500 may be part of a much larger electrical system. Thus, although FIG. 5 depicts direct electrical connections between circuit elements and/or terminals, alternative embodiments may employ intervening circuit elements and/or components while functioning in a substantially analogous manner.

Figure 6:
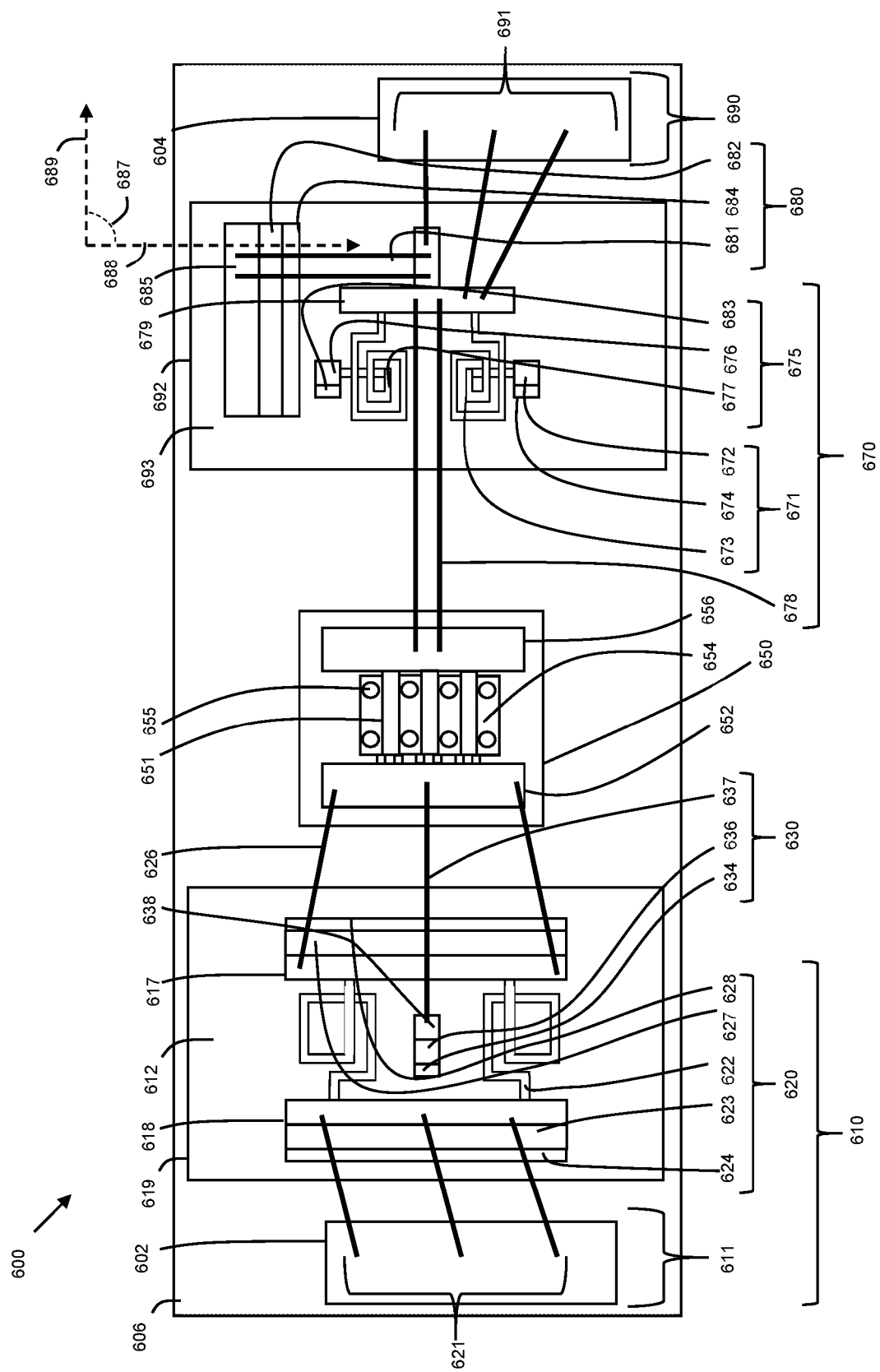
FIG. 6 is a top-down, plan view of an amplifier device in accordance with an example embodiment.

FIG. 6 is a top-down, plan view of a packaged amplifier device in accordance with an example embodiment. Actual physical embodiments of amplifier devices corresponding to the previously-described amplifiers will now be discussed in conjunction with FIGS. 6-8. Starting first with FIG. 6, a top view of a portion of the physical layout of an amplifier device 600 is shown. The packaged amplifier device 600 may include the components depicted schematically in FIGS. 1 and 2. According to an embodiment, the packaged amplifier device 600 may include an input matching circuit 610, an input harmonic termination circuit 630 coupled to the input matching circuit 610, and a GaN transistor die 650 (i.e. first transistor) coupled to the input harmonic termination circuit in accordance with an example embodiment. The drain terminal 656 of the GaN transistor die 650 may be coupled to an output matching die 692, according to an embodiment. The various components of the amplifier device 600 correspond with components depicted in the circuit diagram of FIG. 2. More particularly, corresponding components between FIGS. 1 and 2 and FIGS. 6 and 7 have the same last two numerical digits (e.g., components 110 and 610 are corresponding components, and components 290 and 790 are corresponding components).

Specifically, packaged amplifier device 600 includes an input matching die 619 (e.g., input match circuit 110, 210 and input harmonic termination circuit 130, 230, FIGS. 1,2), a GaN transistor die 650 (e.g., first transistor 650, FIG. 2), and an output matching die 692 (e.g. class-J circuit 170, 270 and output matching circuit 190, 290, FIGS. 1,2) which are electrically coupled together in a cascade arrangement between an input terminal 602 (e.g., input terminal 102, 202, FIGS. 1, 2) to the input matching circuit 210 and an output terminal 604 (e.g., output terminal 204, FIG. 2) of output matching die 692. In various embodiments, the input matching die 619 and the GaN transistor die 650 may be physically and electrically coupled to a base substrate 606. For example, the base substrate 606 may be a printed circuit board (PCB), a conductive flange (e.g., a portion of a leadframe or an individual conductive component), or another suitable substrate. In various embodiments, at least those portions of the surface of the base substrate 606 to which the die 619, 650, and 692 are attached are electrically conductive. In some embodiments, such conductive portions of the base substrate 606 may be electrically coupled to a circuit ground (i.e. reference voltage) (not shown). In addition, such conductive portions of the base substrate 606 also may function as heat sinks for dissipating heat generated by the dies 619 (in the case of an active match embodiment of input matching circuit 610) and GaN transistor die 650 during operation. For example, conductive coins or thermal vias (not illustrated) may be embedded in the base substrate 606, and the dies 610, 650 may be physically coupled to the conductive coins or thermal vias. These coins, vias, or other conductive features, thus, may function as connections to circuit ground and as heat sinks for the dies 619, 650 during operation.

According to an embodiment, the input matching die 619 may include portions of components represented as the input matching circuit 110, 210 as well as the input harmonic termination circuit 130, 230 of FIGS. 1,2. In an embodiment, the input matching die 619 may be configured as an integrated passive device (IPD) wherein the passive components (e.g. capacitors and inductors) may be integrated monolithically within a high-resistivity substrate 612. As used herein, the term "high resistivity" refers to a resistivity that exceeds 1000 ohm-centimeters. In the example embodiment, the high resistivity substrate may include high resistivity silicon. In other embodiments, the high resistivity substrate may include gallium arsenide, gallium nitride, silicon carbide, sapphire, or other high resistivity or insulating materials. In the layout of input matching die 619, certain components of the input impedance matching circuit 210 and the input harmonic termination circuit 230 are duplicated in a parallel and symmetrical manner. To avoid cluttering FIG. 6, reference numbers are not attached to both components in each set of corresponding parallel components. It should be understood which components correspond with each other based on their symmetrical placement and identical depictions.

According to an embodiment, a first input matching section 611 (e.g. first input T-network 211, FIG. 2) may be coupled to a second input matching section 620 (e.g. double T-network 220, FIG. 2) via a first bondwire array 621 (e.g. third input series inductor 221, FIG. 2). In an embodiment, the first input matching section 611 may include the circuit parasitic circuit elements introduced by the electrical connection between the input matching die 619 and the packaging environment (e.g. base substrate 606 and input terminal 602). In an embodiment, the impedances realized by the first input matching section 611 may be represented by the first input T-network 211 of FIG. 2. In an embodiment, the first input matching section 611 may be coupled to a second input matching section 620 (e.g. double T-network 220, FIG. 2). The second input matching section 620 may include a series inductor created by a first bondwire array 621, a shunt capacitor realized as a first integrated input capacitor 623, an integrated input series inductor 622 (e.g. fourth input series inductor 222, FIG. 2) coupled to a first integrated input capacitor 623 (e.g. second input shunt capacitor 223, FIG. 2), and a second integrated input capacitor 627 (e.g. third input shunt capacitor 227, FIG. 2), coupled to the integrated input series inductor 622. In an embodiment, the first integrated input capacitor 623 and the second integrated input capacitor 627 have shunt connections to circuit grounds 624 and 628 (e.g. 224 and 228, FIG. 2) realized using through wafer vias (not shown) in contact with a conductor within the base substrate 606 or another suitable conductor coupled to a ground potential (not shown). In an embodiment, the first bondwire array 621 may form the third input series inductor 221 of the double T-network 220 of FIG. 2 and, as such, the first bondwire array 621 is bonded to the input terminal 602 and to a first input pad 618 integrated into the input matching die 619. In other embodiments, single bondwires or vias integrated into the substrate 600 may be used to couple the various components and/or provide inductance for the first or second matching circuit 611 and 620 of amplifier device 600. In an embodiment, a first output pad 617 is coupled to the second integrated input capacitor 627 and the integrated input series inductor 622. The first output pad 617 may be coupled to the GaN transistor die 650 (e.g. first transistor) by a second bondwire array 626, according to an embodiment. The second bondwire array 626 acts as the final inductor on the input matching circuit (e.g. fifth input series inductor 226, FIG. 2) of the second matching section 620 (e.g. 220, FIG. 2). In an embodiment, the inductance realized by the second bondwire array 626 may be adjusted by altering the length as well as loop height of the bondwires and spacing between the bondwires used to form the second bondwire array 626 above the base substrate 606.

According to an embodiment, an input harmonic termination circuit 630 (e.g. 130, 230, FIGS. 1, 2) may be coupled to gate terminal 652 (i.e. control terminal) of the GaN transistor die 650 (e.g. first transistor 150, 250, FIGS. 1,2). In an embodiment, the input harmonic termination circuit 630 may include an input harmonic termination inductor 637 (e.g. 237, FIG. 2) and may be coupled to a shunt input harmonic termination capacitor 636 (e.g. 236 FIG. 2) via the input harmonic termination contact pad 638. The shunt input harmonic termination capacitor 636 may be realized as an MIM capacitor integrated into input matching die 619, and may be coupled to a circuit ground 634 with the terminal not coupled to the input harmonic inductor 637, according to an embodiment. In an embodiment, the input harmonic termination inductor 637 may be realized using a bondwire. In an embodiment, the inductance realized by the bondwire may be adjusted by altering the length as well as loop height of the bondwire above the base substrate 606. In other embodiments, multiple bondwires may be used to achieve other inductances for the input termination inductor 637. As will be discussed further in connection with FIG. 7, the input harmonic termination inductor and capacitor may be monolithically integrated with the GaN die in other embodiments.

According to an embodiment, the GaN transistor die 650 (i.e. first transistor, e.g. 150, 250 FIG. 1, 2) may be electrically coupled to the input matching die 619 and provides gain between the input harmonic termination circuit 630 and the class-J circuit 670. In an embodiment, the GaN transistor die 650 includes a plurality of device channels 651 configured to allow current to flow from a source terminal 654 (i.e. first current-carrying terminal, 254, FIG. 2) and a drain terminal 656 (i.e. second current-carrying terminal, 256, FIG. 2) wherein the current density through the device channels 651 (and source terminal 654 and drain terminal 656) are controlled by a gate terminal 652 (i.e. control terminal) coupled to the device channels 651, according to an embodiment. In an embodiment, the gate terminal 652 is realized as a pad integrated into GaN transistor die 650. The source terminal 654 is coupled to the backside of the GaN transistor die 650 and to the base substrate 606 through a plurality of through-wafer vias 655, according to an embodiment. Thus, the source terminal may be at circuit ground, according to an embodiment. In an embodiment, the drain terminal 656 is realized as a pad integrated into GaN transistor die 650 on the side opposite the gate terminal 652.

In an embodiment, the drain terminal 656 of the GaN transistor die 650 may be coupled to the class-J circuit 670 by a third bondwire array 678. In an embodiment, the class-J circuit may be partially integrated into an output matching circuit die as an IPD formed within a high resistivity substrate 693 (i.e. "first substrate"). The class-J circuit 670 may include a third bondwire array 678 (e.g. 278, FIG. 2) coupled to a first resonator 671 (e.g. 271, FIG. 2). The third bondwire array 678 may also be coupled to a second resonator 675 (e.g. 275, FIG. 2) that may be coupled to a circuit ground 676 (e.g. 276, FIG. 2). In an embodiment, a shunt inductor realized as a bondwire 681 connected to a bypass capacitor 682 (e.g. 282, FIG. 2) via bondpad 685 may AC couple the first and second resonators 671 and 675 to a circuit ground 684 (e.g. 284, FIG. 4) at a first output matching bonding pad 679 (i.e. "first node", e.g. 279, FIG. 2). In an embodiment, the bondwire 681 may be oriented in a first direction 687 whose angle 688 with respect to a second direction 689 of a signal path direction between the drain terminal of the first transistor 650 and the first output matching bonding pad 679 (i.e. "first node") of the class J circuit is at least 35 degrees. In an embodiment, the angle 688 between the first direction 687 of the bondwire 681 and the second direction of the signal path 689 may be substantially orthogonal. As used herein, the term "orthogonal" means 90 degrees. Because the angle 688 between the first direction 687 of the bondwire 681 and the second direction of the signal path 689 may be orthogonal or nearly orthogonal, the mutual coupling between the bondwire 681, e.g., the third bondwire array 678 may be reduced, according to an embodiment. In such embodiments, the reduced mutual coupling between the inductor (e.g. 281, FIG. 2) realized by the bondwire 681 of the drain terminal 656 of the GaN transistor 650 (i.e. first transistor 150, 250 FIG. 1, 2) and, e.g., the third bondwire array 678, allows the impedance transformation effected by the shunt inductance (e.g. 281, FIG. 2) of the bondwire 681 to not adversely affect the harmonic terminations effected by the first and second resonators 671 and 675, in contrast to cases where there is increased mutual coupling. According to an embodiment, the first resonator 671 includes a first resonator capacitor 672 (e.g. 272, FIG. 2), realized as an MIM capacitor, coupled to a circuit ground 674 (e.g. 274, FIG. 2) and a first resonator inductor 673 (e.g. 273, FIG. 2) that is coupled to the third bondwire array 678 (and ultimately drain terminal 656 of GaN transistor 650) via a first output matching circuit bonding pad 679 ("first node", e.g. 279, FIG. 2). Also, and according to an embodiment, the second resonator 675 may include a second resonator capacitor 676 (e.g. 276, FIG. 2), realized as an MIM capacitor, coupled to a circuit ground 683. The second resonator capacitor may be coupled to a second resonator inductor 677 (e.g. 277, FIG. 2) that is coupled to the third bondwire array 678) via the first output matching pad 679. It should be appreciated that the use of a first resonator 271 and a second resonator 275 are exemplary and that fewer (e.g. only first resonator 271) or additional resonators may be used in other embodiments.

According to an embodiment, an output matching circuit 690 may be realized by coupling the first output matching bonding pad of the class-J circuit to the output terminal 604 (e.g. 204, FIG. 2) via a fourth bondwire array 691 (e.g. 291, FIG. 2). As was the case for the first input match section 611, the output matching network 690 may be represented by a T-network (e.g. 290, FIG. 2), in an embodiment.

Figure 7:
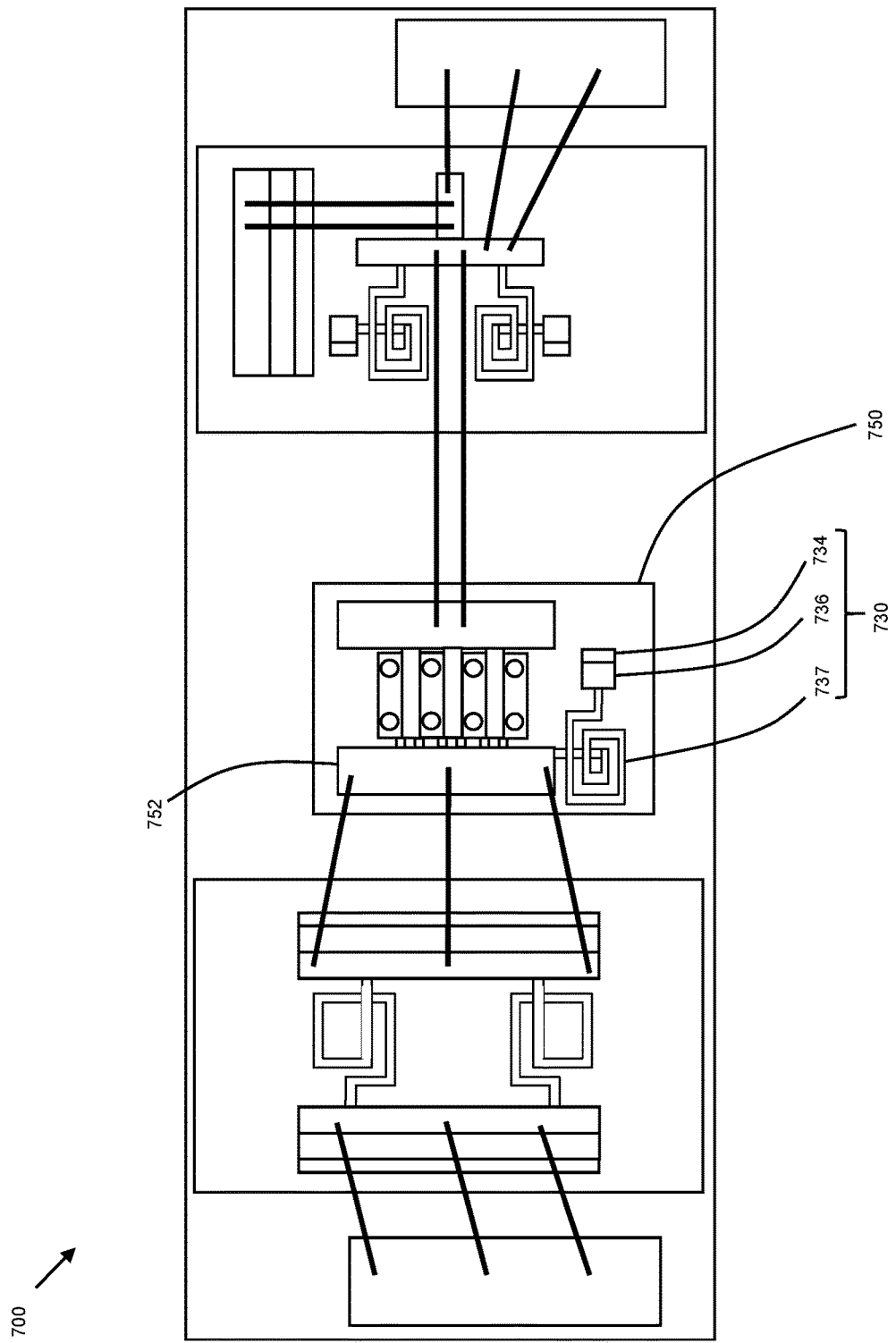
FIG. 7 is a top-down, plan view of an amplifier device in accordance with an example embodiment.

Turning now to FIG. 7, another embodiment of the inventive subject matter may include an amplifier device 700 with an input harmonic termination circuit 730 that is monolithically integrated into the GaN transistor die 750. According to an embodiment, the input harmonic termination circuit 730 (e.g. 130, 230, FIGS. 1, 2) may be coupled to the gate terminal 752 (i.e. control terminal) of the GaN transistor die 750 (e.g. first transistor 150, 250, FIGS. 1,2). In an embodiment, the input harmonic termination circuit 730 may include a monolithic input harmonic termination inductor 737 (e.g. 237, FIG. 2) that may be coupled to a monolithic shunt input harmonic termination capacitor 736 (e.g. 236 FIG. 2), formed adjacent the input harmonic termination inductor 737. The monolithic shunt input harmonic termination capacitor 736 may be realized as an MIM capacitor integrated into the GaN transistor die 750, and may be coupled to a circuit ground 734 with the terminal not coupled to the monolithic input harmonic inductor 737, according to an embodiment.

FIG. 8 is a top-down, plan view of a packaged amplifier device 800 in accordance with an example embodiment. The packaged amplifier device 800 may include an amplifier packaged in a quad flat no-leads (QFN) semiconductor device package (i.e. "no-leads package"), in accordance with an example embodiment. More specifically, the packaged amplifier device 800 includes two parallel amplification paths housed in a QFN semiconductor device package 801. For purpose of brevity, many of the components and circuits of FIG. 8 that have similar counterparts in the embodiments of FIGS. 1-2 and 6-7 are not discussed in detail below. The details of corresponding components discussed above in conjunction with FIGS. 1-2 and 6-7 are intended to apply also to the corresponding components discussed below in conjunction with FIG. 8. Once again, the various components of the packaged amplifier device 800 correspond with components depicted in FIGS. 1-2 and 6-7. More particularly, corresponding components between FIG. 8 and FIGS. 1-2 and 6-7 have the same last two numerical digits (e.g., components 250 and 850 are corresponding components).

The QFN package 801 includes a conductive substrate 806 and a plurality of perimeter lands (e.g., lands 802, 804, 812, 814) that are physically coupled together with non-conductive encapsulation 808. Each of amplification paths 803 and 813 includes an input matching die 819, a GaN transistor die 850, and an output matching die 892 physically connected to the top surface of the substrate 806, in accordance with an example embodiment. Further, each of the amplification paths is electrically coupled between input and output lands 802, 804 (e.g., corresponding to inputs 102, 202, 602, FIGS. 1,2,6, respectively).

In an embodiment, the base substrate 806 includes a flange, which is a rigid electrically-conductive substrate formed from a solid conductive material, and which has a thickness that is sufficient to provide structural support for electrical components and elements of packaged amplifier device 800. In addition, the flange may function as a heat sink for the GaN transistor die 850 and other devices mounted on the flange.

The below description will describe a first amplification path 803 in more detail. It is to be understood that a second amplification path 813 may be identical to or substantially similar to the first amplification path. In an embodiment, the second amplification path 813 may be differently configured (e.g. having a different number of GaN transistors as illustrated here) from the first amplification path. Further, in other embodiments, more than two amplification paths may be housed together in a QFN semiconductor device package.

The first amplifier path 803 includes an input matching die 819, a GaN transistor (i.e. first transistor), and an output matching die 892, which are electrically coupled together in a cascade arrangement between an RF signal input land 802 (e.g., input terminal 102, 202, 602, FIGS. 1, 2, 6) and an RF signal output land 804 (e.g., output terminal 104, 204, 604, FIGS. 1, 2, 6).

The input matching die 819 includes a plurality of integrated circuit components. In an embodiment, the integrated circuitry of the input matching die 819 includes an input pad 818 (e.g. 618, FIG. 6) and a first output pad 817, and an input harmonic termination contact pad 838. The various circuits and components within the input matching die 819 may be configured and electrically coupled together as described previously in conjunction with FIGS. 1-2, 6-7 (e.g. 110, 130, 210, 230, 610, 630, 730, FIGS. 1,2, 6, 7). In an embodiment, each of the signal paths 803 and 813 may consume an area of less than 8 square millimeters. In other embodiments, each of the signal paths 803 and 813 may consume an area of between about 7 and 12 square millimeters. In still other further embodiments, smaller and larger areas of the signal paths 803 and 813 may be used as well. In an embodiment the area of the QFN package 801 may be between 36 and 81 square millimeters, though other larger or smaller areas may be used as well.

The input land 802 may be electrically coupled to the first input pad 818 (e.g. 618, FIG. 6) of the input matching die 819 through one or more wirebonds 821 or other electrical connections (e.g., corresponding to wirebond array 621). The input matching die 819 is coupled to the GaN transistor die 850 via a second bondwire array 837 that couples output pad 838 to the gate terminal 852.

The GaN transistor includes a gate terminal 852 (i.e. "control terminal", e.g., gate terminal 252, 652), a drain terminal 856 (i.e. "second current-carrying terminal" e.g., 256, 656). The components within the GaN transistor die 850 may be configured as described previously in conjunction with FIGS. 2 and 6. The drain terminal 856 of the GaN transistor die 850 is electrically coupled to the harmonic termination node 886 of the output matching die 892 through a wirebond array 878 or other type of electrical connection (e.g., corresponding to connections 678).

The harmonic termination node 886 of the output match die 892 is electrically coupled, through the wirebond array 891 or other type of electrical connection (e.g., corresponding to connections 691, FIG. 6), to the output land 804.

Various embodiments of amplifier devices have been described herein. According to an embodiment, an amplifier device may include an input terminal, an output terminal, a first transistor and a class-J circuit, according to an embodiment. In an embodiment, the first transistor may include a control terminal and first and second current-carrying terminals. In an embodiment, the first transistor may be characterized by a first output capacitance wherein the control terminal is coupled to the input terminal and the first current-carrying terminal. In an embodiment, the first current-carrying terminal may be coupled to a voltage reference. In an embodiment, the class-J circuit may be coupled between the second current-carrying terminal and the output terminal and configured to harmonically terminate the first transistor. According to an embodiment, the class-J circuit may include a first resonator, characterized by a first resonant frequency substantially equal to a second harmonic frequency. In an embodiment, the first resonator may be coupled between the second current-carrying terminal and the voltage reference. A shunt inductor that is distinct from the first resonator may be coupled between the second current-carrying terminal and the voltage reference, according to an embodiment. In an embodiment, the first resonator may be configured to harmonically terminate the first transistor, at the first resonant frequency, in a capacitive reactance. According to an embodiment, the first resonator of the class-J circuit may be coupled to the second terminal of the first transistor by a series inductor configured to resonate with the first output capacitance at a frequency less than the first resonant frequency. An embodiment of the amplifier device may include a second resonator, characterized by a second resonant frequency substantially equal to a third harmonic frequency, coupled between the second current-carrying terminal and the voltage reference. An embodiment may include an input harmonic termination circuit coupled between the input terminal and the control terminal, wherein the input harmonic termination circuit includes an input harmonic termination resonator configured to resonate at the first resonant frequency of the first resonator. The shunt inductor may be configured to transform a fundamental frequency impedance of the output terminal to between 10 ohms and 30 ohms, according to an embodiment. In an embodiment, the first transistor may be selected from a laterally diffused metal oxide semiconductor (LDMOS) field effect transistor and a gallium nitride (GaN) high electron mobility transistor (HEMT). An embodiment may include an input driver circuit that includes a second transistor comprising a second control terminal coupled to the input terminal, a third current-carrying terminal coupled to the voltage reference, and a fourth current-carrying terminal coupled to the control terminal of the first transistor. According to an embodiment, the first transistor includes a GaN HEMT and the second transistor includes a LDMOS field effect transistor.

Embodiments of a packaged amplifier device may include a base substrate, a first input terminal, a first output terminal, a first transistor formed on a semiconductor substrate and coupled to the base substrate that includes a control electrode and first and second current-carrying electrodes. The first transistor may be characterized by a first output capacitance. The control electrode may be coupled to the first input terminal and the first current-carrying electrode may be coupled to a voltage reference. A first class-J circuit may be formed on a first substrate, coupled to the base substrate, that includes a series inductor that couples the second current-carrying terminal to a first resonator at a first node, wherein the first resonator is characterized by a first resonant frequency that is substantially equal to a second harmonic frequency. The first resonator may be integrally formed within the first substrate, coupled between the first node and the voltage reference. The class-J circuit may be configured to harmonically terminate the first transistor. In an embodiment, the series inductor may be configured to resonate with the first output capacitance at a frequency less than the first resonant frequency of the first resonator. An embodiment may include a shunt inductor coupled between the first node of the first class-J circuit and the voltage reference. The shunt inductor may be oriented in a first direction that differs by at least 35 degrees from a second direction of a signal path between the second current-carrying terminal of the first transistor and the first node of the class J circuit, according to an embodiment. In an embodiment, the first direction and the second direction are substantially orthogonal. In an embodiment, the series inductor and the shunt inductor are formed using bond wires. An embodiment may include a second resonator coupled between the second current-carrying terminal and the voltage reference. The class-J circuit may be realized in an integrated passive device formed monolithically on the first substrate, according to an embodiment. An embodiment may include an input harmonic termination circuit that includes an input harmonic termination resonator coupled to an input harmonic termination node. The input harmonic termination node may be coupled to the first input terminal and to the control terminal of the first transistor, according to an embodiment. In an embodiment, at least a portion of the input harmonic termination circuit may be monolithically integrated on the semiconductor substrate of the first transistor.

An embodiment of a packaged amplifier may also include a second input terminal, a second output terminal, and a second transistor formed on a semiconductor substrate that is coupled to the base substrate. The second transistor may include a second control terminal and third and fourth current-carrying terminals, according to an embodiment. The second control terminal may be coupled to the second input terminal and the third current-carrying terminal may be coupled to the voltage reference, according to an embodiment. In an embodiment a second class-J circuit may be formed on a second substrate that is coupled to the base substrate. The second class-J circuit may include a series inductor that couples the fourth current-carrying terminal to a second resonator at a second node. The second resonator may be characterized by a first resonant frequency that is substantially equal to the second harmonic frequency. The second resonator may be integrally formed with the second substrate. The second resonator may be coupled between the second node and the voltage reference. The class-J circuit may be configured to harmonically terminate the second transistor. An embodiment of a packaged amplifier device may further include a no-leads package that includes a first land, and a second land, a connection electrically coupled between the first land and the input terminal, and a third connection electrically coupled between the output terminal and the second land.

Embodiments of the inventive subject matter may also include an amplifier device that includes a first amplifier path that includes an input terminal, an output terminal, a first transistor that includes a control terminal and first and second current-carrying terminals. The first transistor may be characterized by a first output capacitance. The control terminal may be coupled to the input terminal and the first current-carrying terminal may be coupled to a voltage reference. A class-J circuit may be coupled between the second current-carrying terminal and the output terminal and may be configured to harmonically terminate the first transistor. In an embodiment, the class-J circuit may include a first resonator, characterized by a first resonant frequency substantially equal to a second harmonic frequency, coupled between the second current-carrying terminal and the voltage reference and a shunt inductor that is distinct from the first resonator coupled between the second current-carrying terminal and the voltage reference. An embodiment may also include a second amplifier path that includes a second input terminal and a second output terminal. The second amplifier path may include a second transistor that includes a second control terminal and third and fourth current carrying terminals, according to an embodiment. The second control terminal may be coupled to the second amplifier input node, the third current carrying terminal is coupled to a voltage reference, and the fourth current carrying terminal is coupled to the second amplifier output node. In an embodiment, the first amplifier path may be a carrier path of a Doherty amplifier, the second amplifier path may be a peaking path of the Doherty amplifier. An embodiment may also include a splitter having a splitter input and first and second splitter outputs. In an embodiment, the first splitter output may be coupled to the input terminal of the first amplifier path, and the second splitter output may be coupled to the second input terminal of the second amplifier path, and the splitter may be configured to split an input signal received at the splitter input into first and second signals that are provided at the first and second splitter outputs to the first and second amplifier paths. An embodiment may also include a combiner having a summing node and a combiner output. The first and second amplifier output terminals may be coupled to the summing node, and the summing node may be configured to combine the first and second amplified signals received from the first and second amplifier paths into a third amplified signal that is provided to a load coupled to the combiner output, according to an embodiment. In an embodiment, total phase shift between the second current carrying terminal and the summing node is 90 degrees.

For the sake of brevity, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. An amplifier device comprising:
   an input terminal;
   an output terminal;
   a first transistor that includes a control terminal and first and second current-carrying terminals, wherein the first transistor is characterized by a first output capacitance, and wherein the control terminal is coupled to the input terminal, and the first current-carrying terminal is coupled to a voltage reference; and
   a class-J circuit coupled between the second current-carrying terminal and the output terminal at a first node and configured to harmonically terminate the first transistor, wherein the class-J circuit includes a first resonator and a shunt inductor, wherein the first resonator is characterized by a first resonant frequency substantially equal to a second harmonic frequency, and the first resonator is coupled between the first node and the voltage reference, and the shunt inductor is distinct from the first resonator and is coupled between the first node and the voltage reference, and wherein the shunt inductor is configured to increase a fundamental frequency impedance at the first node.

2. The amplifier device of claim 1, wherein the first resonator is configured to harmonically terminate the first transistor, at the first resonant frequency, in a capacitive reactance.

3. The amplifier device of claim 1, wherein the first resonator of the class-J circuit is coupled to the second terminal of the first transistor by a series inductor configured to resonate with the first output capacitance at a frequency less than the first resonant frequency.

4. The amplifier device of claim 1 further comprising a second resonator, characterized by a second resonant frequency substantially equal to a third harmonic frequency, coupled between the second current-carrying terminal and the voltage reference.

5. The amplifier device of claim 1 further comprising an input harmonic termination circuit coupled between the input terminal and the control terminal, wherein the input harmonic termination circuit includes an input harmonic termination resonator configured to resonate at the first resonant frequency of the first resonator.

6. The amplifier of claim 1, wherein the shunt inductor is configured to transform the fundamental frequency impedance of the output terminal to between 10 ohms and 30 ohms.

7. The amplifier device of claim 1, wherein the first transistor is selected from a laterally diffused metal oxide semiconductor (LDMOS) field effect transistor and a gallium nitride (GaN) high electron mobility transistor (HEMT).

8. The amplifier device of claim 1, further comprising an input driver circuit that includes a second transistor comprising a second control terminal coupled to the input terminal, a third current-carrying terminal coupled to the voltage reference, and a fourth current-carrying terminal coupled to the control terminal of the first transistor.

9. The amplifier device of claim 8, wherein the first transistor includes a GaN HEMT and the second transistor includes a LDMOS field effect transistor.

10. The amplifier of claim 1, further comprising:
    a no-leads package that includes a first land, and a second land;
    a first connection electrically coupled between the first land and the input terminal; and
    a second connection electrically coupled between the output terminal and the second land.

11. A packaged amplifier device comprising:
    a base substrate;
    a first input terminal;
    a first output terminal;

a first transistor formed on a semiconductor substrate that is coupled to the base substrate, wherein the first transistor includes a control terminal and first and second current-carrying terminals, wherein the first transistor is characterized by a first output capacitance, and wherein the control terminal is coupled to the first input terminal and the first current-carrying terminal is coupled to a voltage reference;

a first class-J circuit formed on a first substrate that is coupled to the base substrate, wherein the first class-J circuit includes a series inductor that couples the second current-carrying terminal to a first resonator at a first node, wherein the first resonator is characterized by a first resonant frequency that is substantially equal to a second harmonic frequency, wherein the first resonator is integrally formed with the first substrate, and wherein the first resonator is coupled between the first node and the voltage reference, and wherein the class-J circuit is configured to harmonically terminate the first transistor; and a shunt inductor coupled between the first node of the first class-J circuit and the voltage reference, wherein the shunt inductor is configured to increase an impedance of the first node at a fundamental frequency.

12. The packaged amplifier device of claim 11, wherein the series inductor is configured to resonate with the first output capacitance at a frequency less than the first resonant frequency of the first resonator.

13. The packaged amplifier device of claim 11, wherein the shunt inductor is configured to reduce a phase shift of the class-J circuit.

14. The packaged amplifier device of claim 13, wherein the shunt inductor is oriented in a first direction that differs by at least 35 degrees from a second direction of a signal path between the second current-carrying terminal of the first transistor and the first node of the class J circuit.

15. The packaged amplifier device of claim 14, wherein the first direction and the second direction are substantially orthogonal.

16. The packaged amplifier device of claim 14, wherein the series inductor and the shunt inductor are formed using bond wires.

17. The packaged amplifier device of claim 11, further comprising a second resonator coupled between the second current-carrying terminal and the voltage reference.

18. The packaged amplifier device of claim 11, wherein the class-J circuit is realized in an integrated passive device formed monolithically on the first substrate.

19. The packaged amplifier device of claim 11, further comprising an input harmonic termination circuit that includes an input harmonic termination resonator coupled to an input harmonic termination node, wherein the input harmonic termination node is coupled to the first input terminal and to the control terminal of the first transistor.

20. The packaged amplifier device of claim 19, wherein at least a portion of the input harmonic termination circuit is monolithically integrated on the semiconductor substrate of the first transistor.

21. A packaged amplifier device comprising:
a base substrate;
a first input terminal;
a first output terminal;
a first transistor formed on a semiconductor substrate that is coupled to the base substrate, wherein the first transistor includes a control terminal and first and second current-carrying terminals, wherein the first transistor is characterized by a first output capacitance, and wherein the control terminal is coupled to the first input terminal and the first current-carrying terminal is coupled to a voltage reference;

a first class-J circuit formed on a first substrate that is coupled to the base substrate, wherein the first class-J circuit includes a series inductor that couples the second current-carrying terminal to a first resonator at a first node, wherein the first resonator is characterized by a first resonant frequency that is substantially equal to a second harmonic frequency, wherein the first resonator is integrally formed with the first substrate, and wherein the first resonator is coupled between the first node and the voltage reference, and wherein the class-J circuit is configured to harmonically terminate the first transistor;

a second input terminal;
a second output terminal;
a second transistor formed on a semiconductor substrate that is coupled to the base substrate, wherein the second transistor includes a second control terminal and third and fourth current-carrying terminals, wherein the second control terminal is coupled to the second input terminal and the first current-carrying terminal is coupled to the voltage reference; and a second class-J circuit formed on a second substrate that is coupled to the base substrate, wherein the second class-J circuit includes a series inductor that couples the fourth current-carrying terminal to a second resonator at a second node, wherein the second resonator is characterized by the first resonant frequency that is substantially equal to the second harmonic frequency, wherein the second resonator is integrally formed with the second substrate, and wherein the second resonator is coupled between the second node and the voltage reference, and wherein the class-J circuit is configured to harmonically terminate the second transistor.

22. The packaged amplifier device of claim 21, wherein an output power capability of the first transistor differs from an output power capability of the second transistor.

23. An amplifier device comprising:
a first amplifier path that includes
an input terminal,
an output terminal,
a first transistor that includes a control terminal and first and second current-carrying terminals, wherein the first transistor is characterized by a first output capacitance, wherein the control terminal is coupled to the input terminal, and wherein the first current-carrying terminal is coupled to a voltage reference, and, a class-J circuit coupled between the second current-carrying terminal and the output terminal at a first node and configured to harmonically terminate the first transistor, wherein the class-J circuit includes a first resonator and a shunt inductor, wherein the first resonator is characterized by a first resonant frequency substantially equal to a second harmonic frequency, coupled between the first node and the voltage reference, and the shunt inductor is distinct from the first resonator coupled between the first node and the voltage reference, and wherein the shunt inductor is configured to increase an impedance at the first node at a fundamental frequency; and a second amplifier path that includes;
a second input terminal,
a second output terminal, a second transistor that includes a second control terminal and third and fourth current carrying terminals, wherein the second control terminal is coupled to the second input terminal, the third current carrying terminal is coupled to a voltage reference, and the fourth current carrying terminal is coupled to the second output terminal.

24. The amplifier of claim 23, wherein the first amplifier path is a carrier path of a Doherty amplifier, the second amplifier path is a peaking path of the Doherty amplifier, and the amplifier further comprises:
- a splitter having a splitter input and first and second splitter outputs, wherein the first splitter output is coupled to the input terminal of the first amplifier path, and the second splitter output is coupled to the second input terminal of the second amplifier path, and the splitter is configured to split an input signal received at the splitter input into first and second signals that are provided at the first and second splitter outputs to the first and second amplifier paths; and
- a combiner having a summing node and a combiner output, wherein the first and second amplifier output terminals are coupled to the summing node, and the summing node is configured to combine first and second amplified signals received from the first and second amplifier paths into a third amplified signal that is provided to a load coupled to the combiner output.

25. The amplifier of claim 24, wherein a total phase shift between the second current carrying terminal and the summing node is 90 degrees.

* * * * *